(12) United States Patent
Nishihara et al.

(10) Patent No.: US 8,982,564 B2
(45) Date of Patent: Mar. 17, 2015

(54) ELECTRONIC DEVICE

(75) Inventors: Noboru Nishihara, Chiyoda-ku (JP);
Koichi Tatsuyama, Chiyoda-ku (JP);
Hiroshi Mihara, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/110,622

(22) PCT Filed: Jun. 29, 2011

(86) PCT No.: PCT/JP2011/064947
§ 371 (c)(1),
(2), (4) Date: Oct. 8, 2013

(87) PCT Pub. No.: WO2013/001625
PCT Pub. Date: Jan. 3, 2013

(65) Prior Publication Data
US 2014/0029217 A1    Jan. 30, 2014

(51) Int. Cl.
*H05K 7/20* (2006.01)
*H05K 1/02* (2006.01)
*H01L 23/40* (2006.01)

(52) U.S. Cl.
CPC .......... *H05K 1/0271* (2013.01); *H01L 23/4093* (2013.01); *H01L 2924/0002* (2013.01)
USPC ........... 361/720; 361/747; 361/748; 361/760; 439/329; 439/377; 165/80.2

(58) Field of Classification Search
USPC ..................... 361/679.46–679.54, 688–720
See application file for complete search history.

(56) References Cited

U.S. PATENT DOCUMENTS

| | | | | |
|---|---|---|---|---|
| 5,280,409 | A | * | 1/1994 | Selna et al. ................... 361/720 |
| 5,570,271 | A | * | 10/1996 | Lavochkin .................... 361/704 |
| 5,615,735 | A | * | 4/1997 | Yoshida et al. ............. 165/80.3 |
| 5,818,695 | A | * | 10/1998 | Olson .......................... 361/719 |

(Continued)

FOREIGN PATENT DOCUMENTS

| | | |
|---|---|---|
| DE | 102005014162 A1 | 10/2006 |
| DE | 202008017728 U1 | 5/2010 |

(Continued)

OTHER PUBLICATIONS

Korean Office Action (Notice of Preliminary Rejection) dated Jan. 6, 2014, Patent Application No. 10-2013-7031607.

(Continued)

*Primary Examiner* — Courtney Smith
(74) *Attorney, Agent, or Firm* — Sughrue Mion, PLLC; Richard C. Turner

(57) ABSTRACT

An electronic device includes a printed circuit board that has a prohibited region, in which arrangement of a wiring pattern is prohibited, in a fixed region from an outer periphery, an electronic component mounted on the printed circuit board, a heat dissipation fin provided on the electronic component, and a fixing unit that is made of a conductive material and fixes the heat dissipation fin by pressing the fin against the printed circuit board side, wherein a notch is formed in two sides of the printed circuit board that face each other with the electronic component therebetween, and the fixing unit exerts an elastic force that presses the heat dissipation fin against the printed circuit board side by being locked to the notch and is such that hook portions locked to the notch are arranged in the prohibited region.

12 Claims, 11 Drawing Sheets

(56) References Cited

U.S. PATENT DOCUMENTS

| | | | | |
|---|---|---|---|---|
| 5,990,552 | A * | 11/1999 | Xie et al. | 257/718 |
| 6,496,373 | B1 * | 12/2002 | Chung | 361/705 |
| 6,500,028 | B1 | 12/2002 | Higuchi | |
| 6,829,144 | B1 * | 12/2004 | Stutzman et al. | 361/704 |
| 7,692,927 | B2 | 4/2010 | Jin et al. | |
| 2001/0050844 | A1 | 12/2001 | Egawa | |
| 2003/0015343 | A1 * | 1/2003 | Chen | 174/252 |
| 2003/0103332 | A1 * | 6/2003 | Sopko et al. | 361/704 |
| 2004/0136161 | A1 * | 7/2004 | Miyamura et al. | 361/705 |
| 2005/0221873 | A1 | 10/2005 | Kameyama et al. | |
| 2007/0242437 | A1 * | 10/2007 | Tien et al. | 361/700 |
| 2009/0040731 | A1 | 2/2009 | Jin et al. | |
| 2010/0157539 | A1 * | 6/2010 | Wang et al. | 361/709 |
| 2010/0321894 | A1 * | 12/2010 | Wang et al. | 361/709 |

FOREIGN PATENT DOCUMENTS

| | | |
|---|---|---|
| JP | 05-259670 A | 10/1993 |
| JP | 07-022594 U | 4/1995 |
| JP | 2000-183256 A | 6/2000 |
| JP | 2001-015186 A | 1/2001 |
| JP | 2001-015228 A | 1/2001 |
| JP | 2002-280499 A | 9/2002 |
| JP | 2003-100973 A | 4/2003 |
| JP | 2003-319042 A | 11/2003 |
| JP | 2005-150192 A | 6/2005 |
| JP | 2005-283563 A | 10/2005 |
| JP | 2006-229003 A | 8/2006 |
| JP | 2010-062583 A | 3/2010 |
| KR | 10-0639218 B1 | 10/2006 |

OTHER PUBLICATIONS

German Office Action; Application No. 11 2011 105 220.0; dated Jul. 4, 2014.

Communication dated Jul. 22, 2014, issued by the State Intellectual Property Office of the People's Republic of China in counterpart Application No. 201180071917.5.

Taiwanese Office Action; Application No. 10320519980; Apr. 21, 2014.

* cited by examiner

ELECTRONIC DEVICE

CROSS REFERENCE TO RELATED APPLICATIONS

This application is a National Stage of International Application No. PCT/JP2011/064947 filed Jun. 29, 2011, the contents of all of which are incorporated herein by reference in their entirety.

FIELD

The present invention relates to an electronic device.

BACKGROUND

Examples of a conventional heat dissipation structure that conducts heat generated in an electronic component mounted on a printed circuit board away from the electronic component include a heat dissipation structure in which a heat dissipation fin is arranged on an electronic component. Moreover, the heat dissipation efficiency is improved by interposing a heat conductive sheet between the electronic component and the heat dissipation fin. Moreover, screw boss portions are formed on the heat dissipation fin, and the heat dissipation fin and the printed circuit board are fastened together with screws, whereby the heat conductive sheet and the heat dissipation fin are fixed to the printed circuit board.

In such a heat dissipation structure, even if the dimension between the heat transfer surface of the heat dissipation fin and the printed circuit board is varied to a maximum tolerance due to the manufacturing errors of each component, it is necessary to suppress separation of the close contact surfaces between the components and the occurrence of an insufficient compressive load. Moreover, even if the dimension between the heat transfer surface of the heat dissipation fin and the printed circuit board is varied to a minimum tolerance, it is necessary to suppress the strain and deflection of the printed circuit board such that the printed circuit board is not damaged.

Therefore, a thick heat conductive sheet is used from the beginning so that the heat conductive sheet can be deformed in accordance with a change in the distance between the heat transfer surface of the heat dissipation fin and the printed circuit board. However, if the thickness of the heat conductive sheet is increased, the heat resistance increases. Thus, there is a problem in that a sufficient heat dissipation performance cannot be obtained. Moreover, there is a problem in that an increase in the thickness of the heat conductive sheet inhibits size reduction of the product.

Consequently, for example, Patent Literature 1 discloses a fixing unit that can fix both components by causing an elastic spring to be locked by a hook-shaped component mounted on the printed circuit board. With this fixing unit, even if the distance between the heat transfer surface of the heat dissipation fin and the printed circuit board changes, a contact force can be applied between the heat dissipation fin and the heat conductive sheet by the spring. Therefore, it is possible to suppress separation of the close contact surfaces between the components and the occurrence of an insufficient compressive load.

CITATION LIST

Patent Literature

Patent Literature 1: Japanese Patent Application Laid-open 2005-150192

SUMMARY

Technical Problem

However, according to the conventional technology described above, because the hook that locks the spring is mounted on the printed circuit board, there is an additional need for the footprint for the hook. Furthermore, it is necessary to provide an insulation distance from the electronic components arranged around the hook; therefore, there is a problem in that the region in which the arrangement of the components is limited increases on the printed circuit board, which is a significant constraint on high-density mounting of electronic components.

The present invention is achieved in view of the above and has an object to provide an electronic device capable of suppressing separation of the close contact surfaces and an insufficient compressive load or excessive strain and deflection of a printed circuit board, which occur due to the manufacturing errors of each component, while maintaining the performance of dissipating heat from an electronic component that generates heat.

Solution to Problem

In order to solve the above problems and achieve the object, the present invention includes a printed circuit board that has a prohibited region, in which arrangement of a wiring pattern is prohibited, in a fixed region from an outer periphery, an electronic component mounted on the printed circuit board, a heat dissipation fin provided on the electronic component, and a fixing unit that is made of a conductive material and fixes the heat dissipation fin by pressing the heat dissipation fin against the printed circuit board side, wherein a notch is formed in two sides of the printed circuit board, the two sides facing each other with the electronic component therebetween, and the fixing unit exerts an elastic force that presses the heat dissipation fin against the printed circuit board side by being locked to the notch and the fixing unit is such that a hook portion that is locked to the notch is arranged in the prohibited region.

Advantageous Effects of Invention

The electronic device according to the present invention is such that, even when the distance between the heat transfer surface of the heat dissipation fin and the electronic component is varied to minimum or maximum due to the manufacturing errors of each component, because the fixing unit applies an appropriate contact load to the heat dissipation fin and the like due to the elastic force in accordance with the manufacturing errors, excessive strain and deflection can be prevented from being generated in the printed circuit board and a stable heat dissipation effect can be obtained.

Moreover, because the hook portions are arranged in the prohibited region, in which the arrangement of a wiring pattern is prohibited as a countermeasure against static electricity from the outside of the casing, it is not necessary to impose a restriction on the arrangement of components. Such a restriction is necessary when the hook portions are provided on the inner side of the prohibited region. Consequently, high-density mounting is enabled in the electronic device.

Moreover, when static electricity enters from the outside, the hook portions made of a conductive material function similarly to a lightning rod; therefore, it becomes possible to arrange a wiring pattern and the like even in the prohibited region as long as they are arranged on the inner side of the hook portions. Consequently, further high-density mounting is enabled in the electronic device.

DESCRIPTION OF EMBODIMENTS

A fixing unit and an electronic device according to embodiments of the present invention are described below in detail with reference to the drawings. This invention is not limited to the embodiments.

First Embodiment

Figure 1:
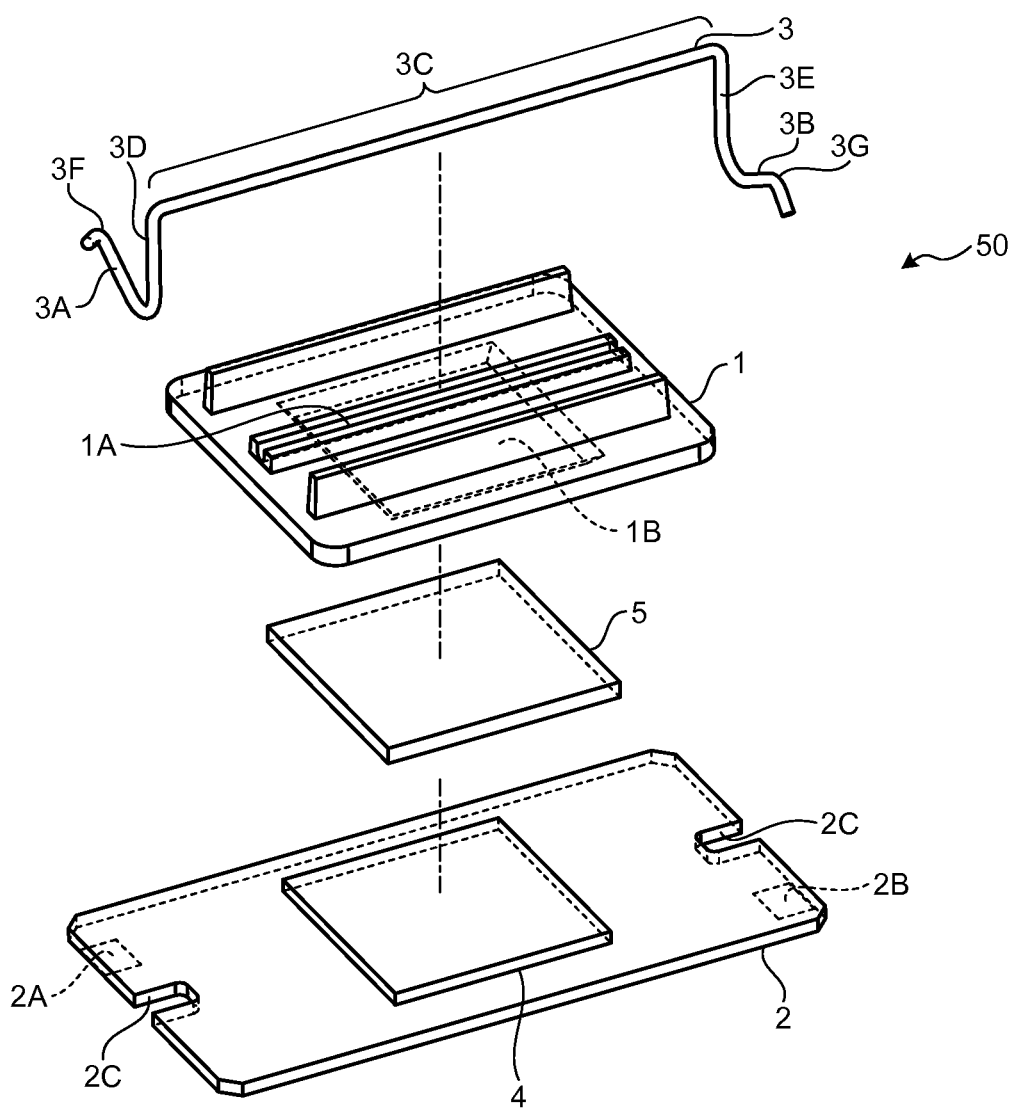
FIG. 1 is an exploded perspective view of an electronic device according to a first embodiment of the present invention and is a diagram illustrating the configuration of a heat dissipation fin, a printed circuit board, a heat conductive sheet, and a spring that is a fixing unit.
Figure 2:
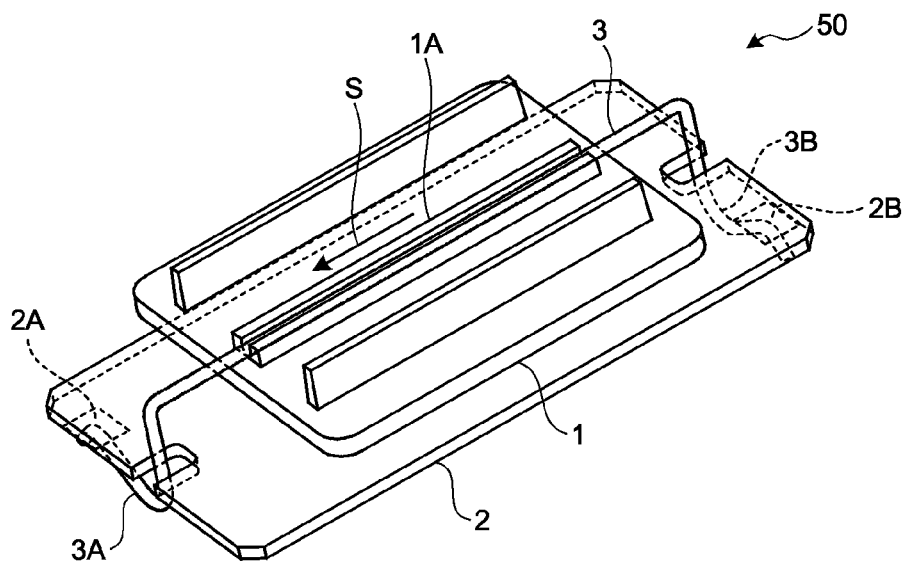
FIG. 2 is a perspective view of the electronic device illustrated in FIG. 1 and is a diagram illustrating a state where the heat dissipation fin is fixed to the printed circuit board with the spring.
Figure 3:
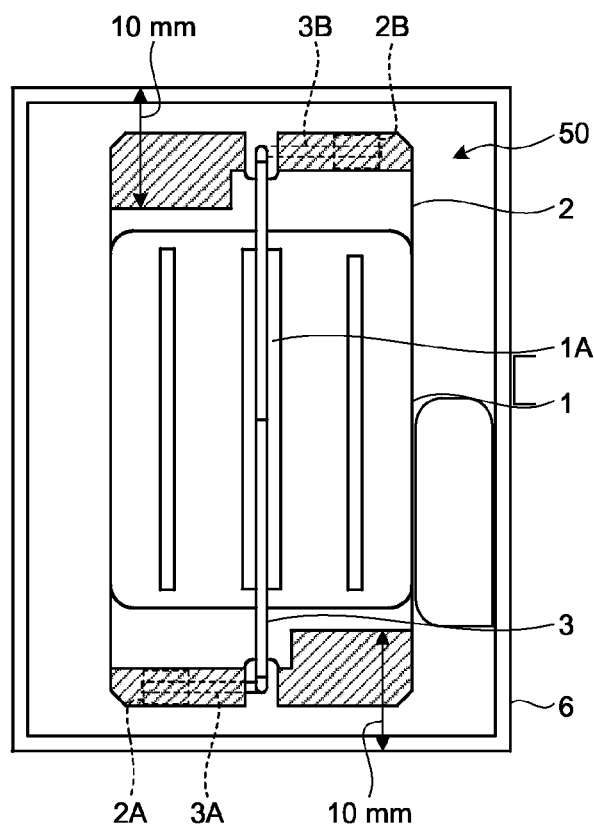
FIG. 3 is a plan view of the electronic device illustrated in FIG. 1 and is a diagram illustrating a state where the heat dissipation fin is fixed to the printed circuit board with the spring.
Figure 4:
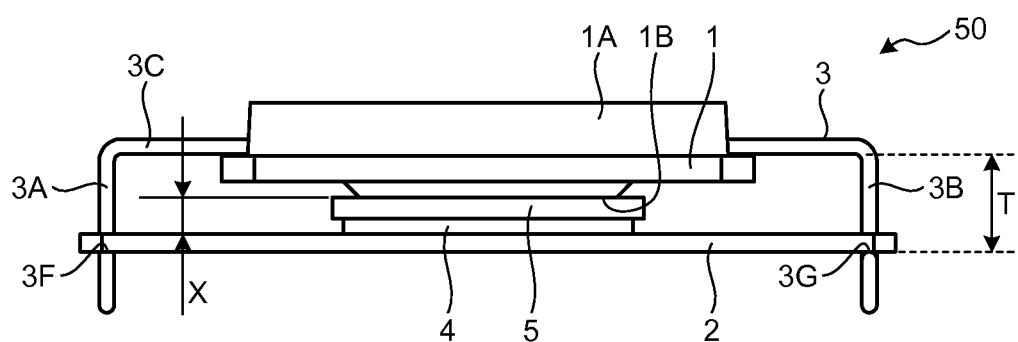
FIG. 4 is a front view of the electronic device illustrated in FIG. 1 and is a diagram illustrating a state where the heat dissipation fin is fixed to the printed circuit board with the spring.

FIG. 1 is an exploded perspective view of an electronic device according to the first embodiment of the present invention and is a diagram illustrating the configuration of a heat dissipation fin, a printed circuit board, a heat conductive sheet, and a spring that is a fixing unit. FIG. 2 is a perspective view of the electronic device illustrated in FIG. 1 and is a diagram illustrating a state where the heat dissipation fin is fixed to the printed circuit board with the spring. FIG. 3 is a plan view of the electronic device illustrated in FIG. 1 and is a diagram illustrating a state where the heat dissipation fin is fixed to the printed circuit board with the spring. FIG. 4 is a front view of the electronic device illustrated in FIG. 1 and is a diagram illustrating a state where the heat dissipation fin is fixed to the printed circuit board with the spring.

An electronic device 50 includes a heat dissipation fin 1, an electronic component 4, a printed circuit board 2, a heat conductive sheet 5, and a spring (fixing unit) 3. The electronic component 4 is mounted on the printed circuit board 2. The electronic component 4 generates heat when the electronic device 50 is in operation. The heat conductive sheet 5 is interposed between the heat dissipation fin 1 and the electronic component 4.

The heat generated in the electronic component 4 is dissipated by being transferred to the heat dissipation fin 1 via the heat conductive sheet 5. In order to appropriately dissipate the heat generated in the electronic component 4 from the heat dissipation fin 1, it is necessary that the electronic component 4 and the heat conductive sheet 5 are in close contact with each other and the heat conductive sheet 5 and the heat dissipation fin 1 are in close contact with each other over a region equal to or greater than a predetermined area.

The spring 3 fixes the heat dissipation fin 1 and the heat conductive sheet 5 to the electronic component 4. Moreover, the spring 3 exerts an elastic force that presses the heat dissipation fin 1 and the heat conductive sheet 5 against the electronic component 4 side so that the electronic component 4 and the heat conductive sheet 5 and the heat conductive sheet 5 and the heat dissipation fin 1 are appropriately in close contact with each other.

Notches 2C to hook the spring 3 are formed in the printed circuit board 2. The notch 2C is formed in each of two sides of the printed circuit board 2, the two sides facing each other with the electronic component 4 therebetween.

The spring 3 has a shape obtained by bending one rod-like member at a plurality of points. The spring 3 includes a spring central portion 3C that presses the heat dissipation fin 1 against the printed circuit board 2 side, spacing portions 3D and 3E that are portions bent toward the printed circuit board 2 side at both ends of the spring central portion 3C, and hook portions 3A and 3B that are portions bent at the ends of the spacing portions 3D and 3E in a direction parallel to the sides in which the notches 2C are formed.

The spring central portion 3C has a length shorter than the length of the sides of the printed circuit board 2 in which the notches 2C are not formed. The spacing portions 3D and 3E are formed to have a length longer than the sum of the thickness of the printed circuit board 2, the thickness of the electronic component 4, the thickness of the heat conductive sheet 5, and the distance (hereinafter, referred to simply as the thickness of the heat dissipation fin 1) between the bottom portion of a guide groove 1A formed in the heat dissipation fin 1 and the contact surface with the heat conductive sheet 5. Consequently, the spacing portions 3D and 3E extend through the notches 2C.

The hook portions 3A and 3B are bent toward the printed circuit board 2 side to form acute angles relative to the spacing portions 3D and 3E. Moreover, a distance T (see also FIG. 4) between tips 3F and 3G of the hook portions 3A and 3B and the spring central portion 3C is set to be smaller than the sum of the thickness of the printed circuit board 2, the thickness of the electronic component 4, the thickness of the heat conductive sheet 5, and the thickness of the heat dissipation fin 1 when they are fixed at an appropriate pressure.

Consequently, when the heat dissipation fin 1 and the like are fixed, the spring 3 can use the restoring force at the bent portions between the spacing portions 3D and 3E and the hook portions 3A and 3B as an elastic force that presses the heat dissipation fin 1 and the like against the printed circuit board 2 side.

As described above, the spring 3 basically has a point symmetrical shape. Moreover, in order to maintain the contact stability of the tips 3F and 3G of the spring 3, it is desirable to form the spring 3 in a bent shape as described above. Moreover, it is preferable to use an elastic material having excellent electrical conductivity for the spring 3. For example, a metal material can be used.

In a state where the spacing portion 3D is fit into the notch 2C of the printed circuit board 2 and the hook portion 3A is hooked onto a locking portion 2A of the printed circuit board 2, the spring central portion 3C is fit into the guide groove 1A provided in the heat dissipation fin 1 and the spring 3 is slid in the direction indicated by the arrow S in FIG. 2, whereby the spring 3 can fix the heat dissipation fin 1 and the printed circuit board 2 to the electronic component 4.

When the spring 3 is slid in the direction indicated by the arrow S, the spacing portion 3E is also fit into the notch 2C and the hook portion 3B is also hooked onto a locking portion 2B. The locking portions 2A and 2B are electrically connected to the ground wiring pattern of the printed circuit board 2. Therefore, the electrical conduction between the ground wiring pattern on the printed circuit board 2 and the heat dissipation fin 1 can be obtained via the spring 3.

As illustrated in FIG. 3, in some cases, the electronic device is used while being accommodated in a casing 6. The hook portions 3A and 3B of the spring 3 are arranged in a prohibited region, in which the arrangement of the electronic component 4 and a signal wiring pattern is prohibited so that they are not damaged by static electricity from the outside of the casing 6. For example, the prohibited region is set as a region that is within 10 mm from the outer surface of the casing 6.

The hook portions 3A and 3B of the spring 3 are arranged in the prohibited region; therefore, they function similarly to a lightning rod. In the region on the inner side of the hook portions 3A and 3B that function as a lightning rod, it is satisfactory to maintain only the insulation distance with respect to the peripheral electronic component 4; therefore, it is possible to reduce the region in which the arrangement of components and a signal wiring pattern is restricted. In FIG. 3, the prohibited region in the case where the spring 3 is used is illustrated as a hatched region. As illustrated in FIG. 3, in the portions in which the hook portions 3A and 3B are arranged, the prohibited region becomes smaller than that in other portions.

In other words, on the inner side of the hook portions 3A and 3B, even in the region that is originally defined as the prohibited region, a signal wiring pattern can be arranged. Consequently, an effect can be obtained where the footprint on the printed circuit board 2 can be kept large. Moreover, high-density mounting in the electronic device 50 can be achieved.

Moreover, it is satisfactory to form the notches 2C in the printed circuit board 2 to lock the spring 3; therefore, reduction of the footprint on the printed circuit board 2 can be prevented. Consequently, an effect can be obtained where the footprint on the printed circuit board 2 can be kept large. Moreover, high-density mounting in the electronic device 50 can be achieved.

As illustrated in FIG. 4, use of the spring 3 to fix the heat dissipation fin 1 and the like facilitates fixing of the electronic component 4 and the like to the printed circuit board 2 with an appropriate load. Moreover, even if the dimension X between a heat transfer surface 1B of the heat dissipation fin 1 and the printed circuit board 2 becomes different from the design dimension due to the accumulation of the manufacturing errors of each component, the spring 3 deforms following the difference and an appropriate load can be easily applied to the electronic component 4 and the like due to the elastic force of the spring 3. Therefore, it is not necessary to use a thick heat conductive sheet from the beginning, which contributes to the size reduction of the device.

Moreover, even if the dimension X becomes different, the heat dissipation fin 1 and the printed circuit board 2 can be appropriately brought into close contact with the heat conductive sheet 5 by applying an appropriate load to the electronic component 4.

Consequently, a gap is not easily generated between the heat transfer surface 1B and the heat conductive sheet 5. Therefore, degradation of the heat dissipation performance of the heat dissipation fin 1 can be prevented and thus stable heat dissipation can be realized. Moreover, separation of the mounted electronic component 4 from the printed circuit board 2 and breaking of a wiring pattern do not easily occur.

Second Embodiment

Figure 5:
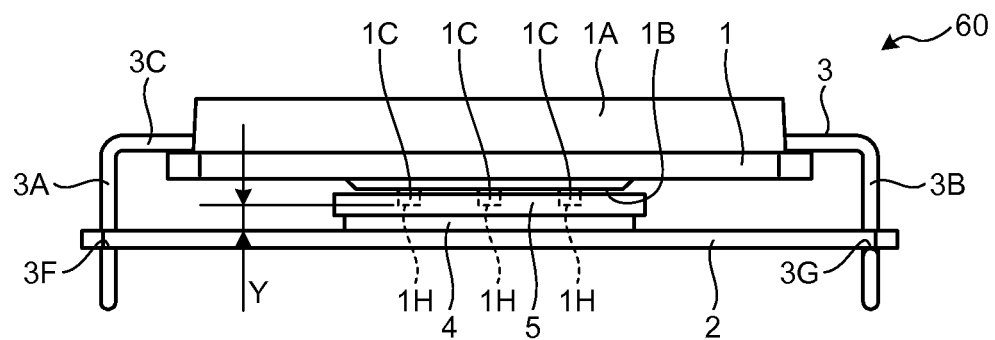
FIG. 5 is a front view of an electronic device according to a second embodiment of the present invention and is a diagram illustrating a state where a heat dissipation fin is fixed to a printed circuit board with a spring.
Figure 6:
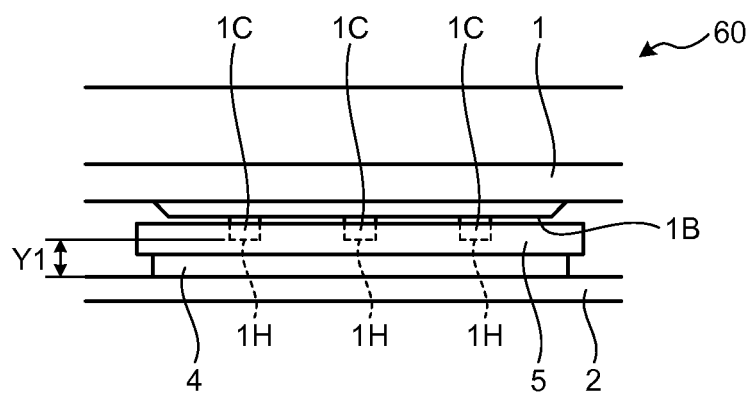
FIG. 6 is a partially enlarged view in which projection portions formed on the heat transfer surface of the heat dissipation fin illustrated in FIG. 5 are enlarged and is a diagram illustrating an example in which the dimension between the heat transfer surface of the heat dissipation fin and the printed circuit board is varied to a minimum tolerance.
Figure 7:
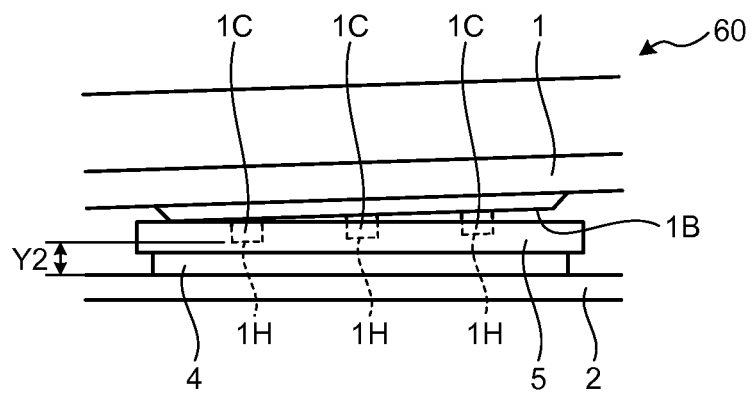
FIG. 7 is a partially enlarged view in which the projection portions formed on the heat transfer surface of the heat dissipation fin illustrated in FIG. 5 are enlarged and is a diagram illustrating an example in which the heat dissipation fin is fixed at an angle.
Figure 8:
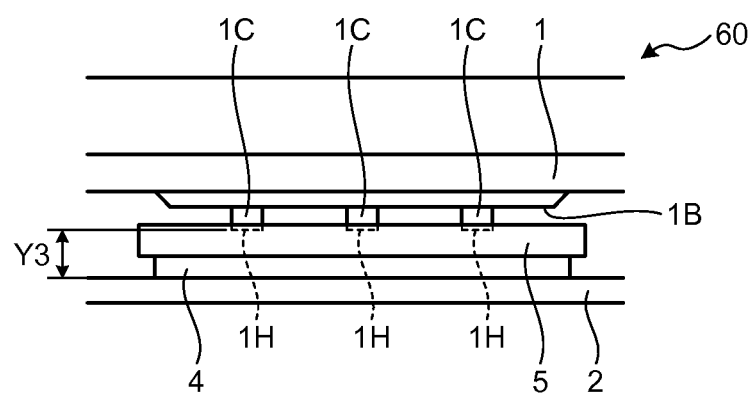
FIG. 8 is a partially enlarged view in which the projection portions formed on the heat transfer surface of the heat dissipation fin illustrated in FIG. 5 are enlarged and is a diagram illustrating an example in which the dimension between the heat transfer surface of the heat dissipation fin and the printed circuit board is varied to a maximum tolerance.

FIG. 5 is a front view of an electronic device according to the second embodiment of the present invention and is a diagram illustrating a state where a heat dissipation fin is fixed to a printed circuit board with a spring. FIG. 6 is a partially enlarged view in which projection portions formed on the heat transfer surface of the heat dissipation fin illustrated in FIG. 5 are enlarged and is a diagram illustrating an example in which the dimension between the heat transfer surface of the heat dissipation fin and the printed circuit board is varied to a minimum tolerance. FIG. 7 is a partially enlarged view in which the projection portions formed on the heat transfer surface of the heat dissipation fin illustrated in FIG. 5 are enlarged and is a diagram illustrating an example in which the heat dissipation fin is fixed at an angle. FIG. 8 is a partially enlarged view in which the projection portions formed on the heat transfer surface of the heat dissipation fin illustrated in FIG. 5 are enlarged and is a diagram illustrating an example in which the dimension between the heat transfer surface of the heat dissipation fin and the printed circuit board is varied to a maximum tolerance. The configurations similar to those in the above embodiment are denoted by the same reference numerals and a detailed explanation thereof is omitted.

In an electronic device 60 according to the second embodiment, a plurality of projections 1C are formed on the heat transfer surface 1B of the heat dissipation fin 1. The heat dissipation fin 1 is not in contact with the heat conductive sheet 5 over the entire heat transfer surface 1B but is in contact with the heat conductive sheet 5 at the portions of the projections 1C. Therefore, the amount the projections 1C bite into the heat conductive sheet 5 becomes easy to change in accordance with the load applied to the heat dissipation fin 1.

Moreover, the projections 1C are formed such that even if a portion other than the projections 1C of the heat transfer surface 1B is not in contact with the heat conductive sheet 5, it is possible to obtain a contact area with the heat conductive sheet 5 sufficient to appropriately dissipate the heat generated in the electronic component 4. In other words, if apexes 1H of all the projections 1C formed on the heat transfer surface 1B are in contact with the heat conductive sheet 5, a sufficient contact area can be obtained.

The dimension from the apexes 1H of the projections 1C to the printed circuit board 2 is defined as Y. The locking method of the spring 3 and the effect obtained by causing the hook portions 3A and 3B to function similarly to a lightning rod are similar to those described in the first embodiment.

Specifically, in a similar manner to the first embodiment described above, the electronic component 4 and the heat dissipation fin 1 are fixed to the printed circuit board 2 by pressing them with an appropriate load by using the spring 3. The projections 1C bite into the heat conductive sheet 5 such that a clearance is always maintained between the heat transfer surface 1B and the heat conductive sheet 5.

Therefore, as illustrated in FIG. 6, even if the dimension Y1 becomes minimum due to the accumulation of the manufacturing errors of each component, the amount the projections 1C bite into the heat conductive sheet 5 becomes large, which prevents an excessive load from being applied to the electronic component 4 and the printed circuit board 2. Consequently, the electronic component 4 can be prevented from being damaged and the printed circuit board 2 can be prevented from being deformed. Obviously, strain and deflection of the printed circuit board 2, which cause separation of the mounted electronic component and breaking of a wiring pattern, are not easily caused.

Moreover, as illustrated in FIG. 7, even if the heat dissipation fin 1 or the electronic component 4 is tilted and the dimension Y2 partially becomes minimum, if the projections 1C are in contact with the heat conductive sheet 5, degradation of the heat dissipation performance is prevented, enabling stable heat dissipation.

Moreover, as illustrated in FIG. 8, if the dimension Y3 becomes maximum due to the accumulation of the manufacturing errors of each component, only the amount the projections 1C bite into the heat conductive sheet 5 becomes small. Even in this state, because the apexes 1H of the projections 1C are in contact with the heat conductive sheet 5, degradation of the heat dissipation performance can be prevented. Moreover, an insufficient compressive load and contact area does not easily occur, enabling stable heat dissipation.

Third Embodiment

Figure 9:
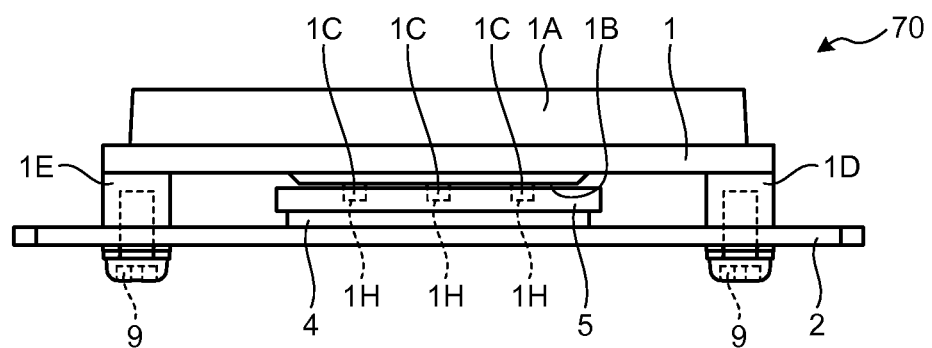
FIG. 9 is a front view of an electronic device according to a third embodiment of the present invention and is a diagram illustrating a state where a heat dissipation fin is fixed to a printed circuit board with screws.
Figure 10:
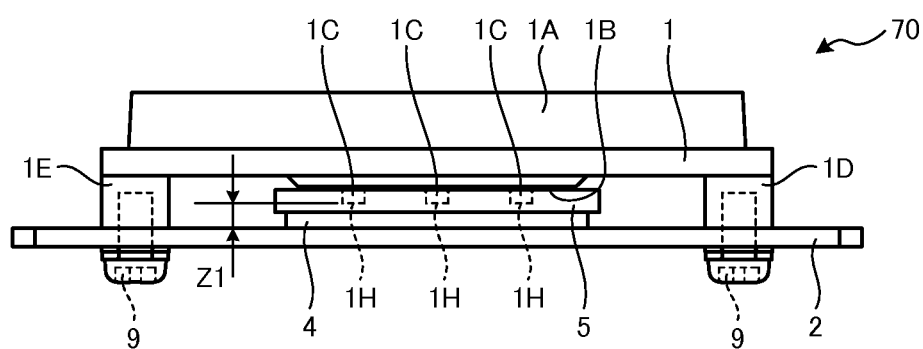
FIG. 10 is a front view of the electronic device illustrated in FIG. 9 and is a diagram illustrating an example in which the dimension between the heat transfer surface of the heat dissipation fin and the printed circuit board is varied to a minimum tolerance.
Figure 11:
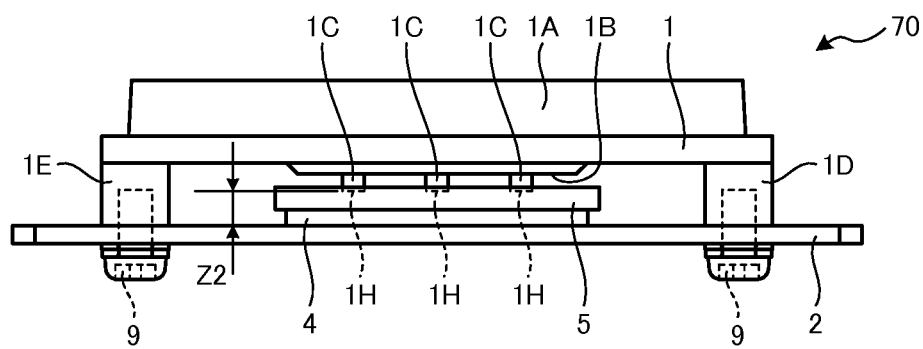
FIG. 11 is a front view of the electronic device illustrated in FIG. 9 and is a diagram illustrating an example in which the dimension between the heat transfer surface of the heat dissipation fin and the printed circuit board is varied to a maximum tolerance.

FIG. 9 is a front view of an electronic device according to the third embodiment of the present invention and is a diagram illustrating a state where a heat dissipation fin is fixed to a printed circuit board with screws. FIG. 10 is a front view of the electronic device illustrated in FIG. 9 and is a diagram illustrating an example in which the dimension between the heat transfer surface of the heat dissipation fin and the printed circuit board is varied to a minimum tolerance. FIG. 11 is a front view of the electronic device illustrated in FIG. 9 and is a diagram illustrating an example in which the dimension between the heat transfer surface of the heat dissipation fin and the printed circuit board is varied to a maximum tolerance. The configurations similar to those in the above embodiments are denoted by the same reference numerals and a detailed explanation thereof is omitted.

In an electronic device 70 according to the third embodiment, the printed circuit board 2 on which the electronic component 4 is mounted is directly fixed to bosses 1D and 1E provided on the heat dissipation fin 1 with screws 9. Moreover, the projections 1C are provided on the heat transfer surface 1B of the heat dissipation fin 1 in a similar manner to the second embodiment described above.

The projections 1C provided on the heat transfer surface 1B of the heat dissipation fin 1 bite into the heat conductive sheet 5 such that a clearance is always maintained between the heat transfer surface 1B and the heat conductive sheet 5. Moreover, the amount the projections 1C bite into the heat conductive sheet 5 easily changes in accordance with the load applied to the heat dissipation fin 1.

Therefore, as illustrated in FIG. 10, if the dimension Z1 becomes minimum due to the accumulation of the manufacturing errors of each component, in a similar manner to the second embodiment, strain and deflection of the printed circuit board 2, which cause separation of the electronic component and breaking of a wiring pattern, are not easily caused.

Moreover, as illustrated in FIG. 11, even if the dimension Z2 becomes maximum, a clearance is generated between the projections 1C provided on the heat transfer surface 1B of the heat dissipation fin and the heat conductive sheet 5; therefore, separation of the heat conductive sheet 5 and an insufficient compressive load and contact area do not easily occur, enabling stable heat dissipation.

Fourth Embodiment

Figure 12:
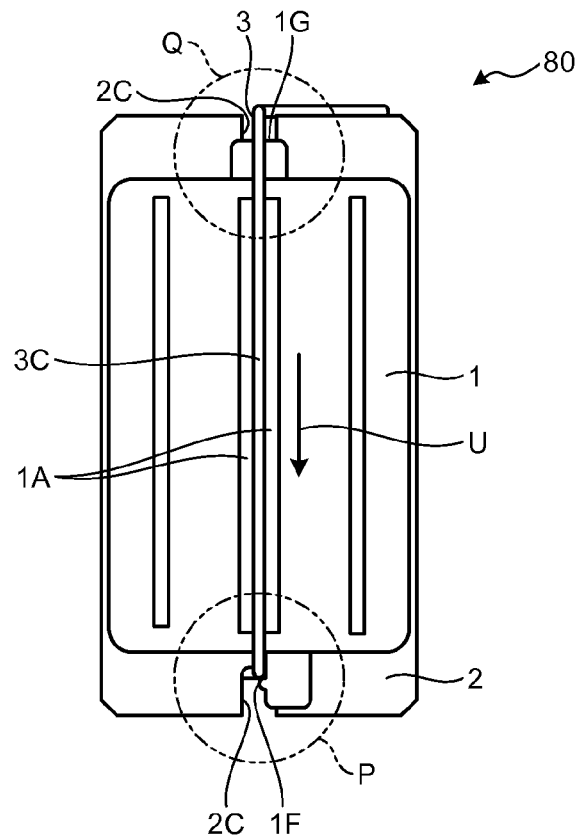
FIG. 12 is a plan view of an electronic device according to a fourth embodiment of the present invention and is a diagram for explaining a fixing method of a heat dissipation fin with a spring.
Figure 13:
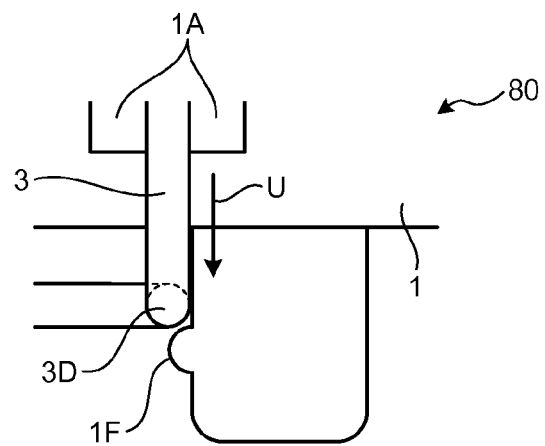
FIG. 13 is a partially enlarged view in which a portion P illustrated in FIG. 12 is enlarged and is a diagram illustrating a state before the heat dissipation fin is fixed with the spring.
Figure 14:
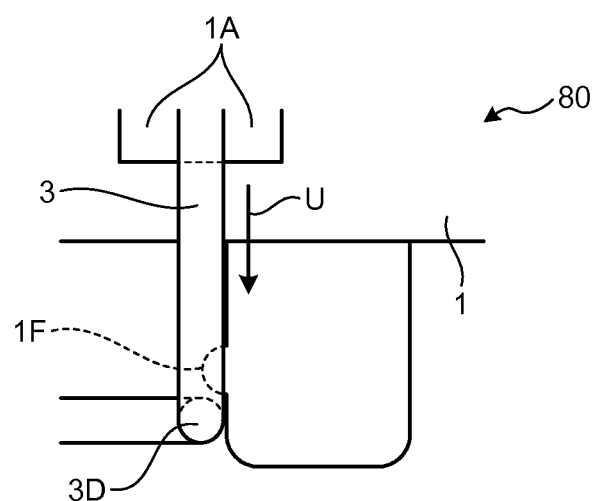
FIG. 14 is a partially enlarged view in which the portion P illustrated in FIG. 12 is enlarged and is a diagram illustrating a state after the heat dissipation fin is fixed with the spring.
Figure 15:
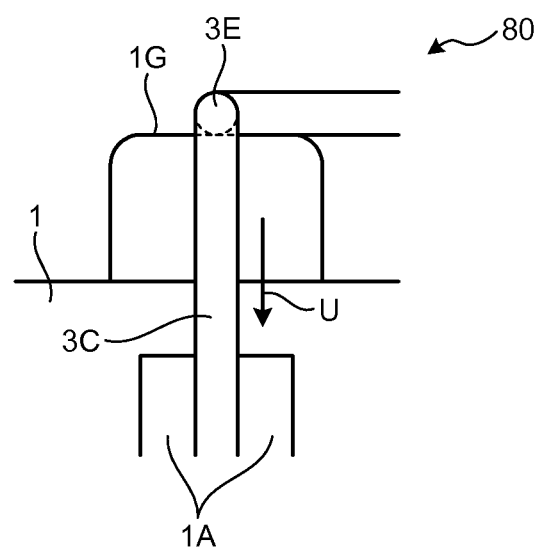
FIG. 15 is a partially enlarged view in which a portion Q illustrated in FIG. 12 is enlarged and is a diagram illustrating a state after the heat dissipation fin is fixed with the spring.

FIG. 12 is a plan view of an electronic device according to the fourth embodiment of the present invention and is a diagram for explaining a fixing method of a heat dissipation fin with a spring. FIG. 13 is a partially enlarged view in which a portion P illustrated in FIG. 12 is enlarged and is a diagram illustrating a state before the heat dissipation fin is fixed with the spring. FIG. 14 is a partially enlarged view in which the portion P illustrated in FIG. 12 is enlarged and is a diagram illustrating a state after the heat dissipation fin is fixed with the spring. FIG. 15 is a partially enlarged view in which a portion Q illustrated in FIG. 12 is enlarged and is a diagram illustrating a state after the heat dissipation fin is fixed with the spring. The configurations similar to those in the above embodiments are denoted by the same reference numerals and a detailed explanation thereof is omitted.

In an electronic device 80 according to the present embodiment, a structure is provided such that when the electronic device 80 is being assembled, an assembly worker can recognize that the heat dissipation fin 1 and the like are appropriately fixed with the spring 3.

More specifically, in a portion of the notch 2C of the printed circuit board 2 on the side in the direction indicated by the arrow U, a projection portion 1F, which protrudes into the movement path of the spacing portion 3D when the spring 3 moves in the direction indicated by the arrow U, is formed. In the fourth embodiment, the projection portion 1F is formed on the heat dissipation fin 1; however, it is not limited thereto and the projection portion 1F may be formed, for example, on the printed circuit board 2.

Moreover, in a portion of the notch 2C of the printed circuit board 2 on the side opposite to the direction indicated by the arrow U, a contact portion 1G, which comes into contact with the spring 3 when the spring 3 is appropriately moved in the direction indicated by the arrow U, is formed. In the fourth embodiment, the contact portion 1G is formed on the heat dissipation fin 1; however, it is not limited thereto and the contact portion 1G may be formed, for example, on the printed circuit board 2.

As described above, the projection portion 1F is formed; therefore, when the spring 3 is moved in the direction indicated by the arrow U, first, the spacing portion 3D comes into contact with the projection portion 1F. Thus an assembly worker feels resistance (see also FIG. 13). When the spring 3 is further moved in the direction indicated by the arrow U, the spacing portion 3D rides over the projection portion 1F (see also FIG. 14).

At this point, an assembly worker can recognize that the spring 3 has moved to an appropriate position by sensing that the resistance decreases or by a clicking noise. Consequently, an assembly worker can definitely recognize that the heat dissipation fin 1 and the like are appropriately fixed with the spring 3.

Moreover, because the movement of the spring 3 to the side opposite to the direction indicated by the arrow U is restricted by the projection portion 1F, for example, when the electronic device 80 is carried, a failure, such as unintentional removal of the spring 3, can be prevented.

Furthermore, when the spring 3 is moved to an appropriate position, the spacing portion 3E comes into contact with the contact portion 1G and further movement of the spring 3 is restricted. Consequently, the spring 3 can be prevented from moving in the direction indicated by the arrow U more than necessary and fixing of the heat dissipation fin 1 and the like with the spring 3 can be prevented from becoming uncertain.

Fifth Embodiment

Figure 16:
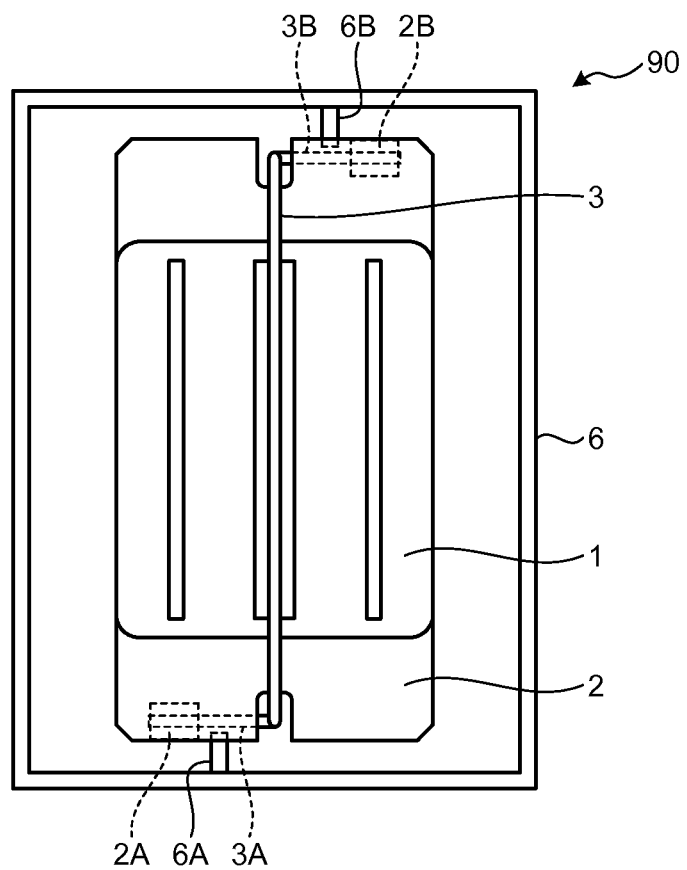
FIG. 16 is a plan view of an electronic device according to a fifth embodiment of the present invention.

FIG. 16 is a plan view of an electronic device according to the fifth embodiment of the present invention. The configurations similar to those in the above embodiments are denoted by the same reference numerals and a detailed explanation thereof is omitted. An electronic device 90 according to the fifth embodiment includes the casing 6, which accommodates the printed circuit board 2 and the like.

The configuration is such that the movement that the spring 3 tends to come off the printed circuit board 2 is restricted by ribs 6A and 6B, which are provided on the inner wall of the casing 6, coming into contact with the hook portions 3A and 3B. With this configuration, even if a force acts in a direction in which the spring 3 comes off the locking portions 2A and 2B of the printed circuit board 2 due to an impact, such as strong vibration and dropping, the hook portions 3A and 3B interfere with the ribs 6A and 6B, respectively; therefore, the spring 3 can be prevented from coming off.

Figure 17:
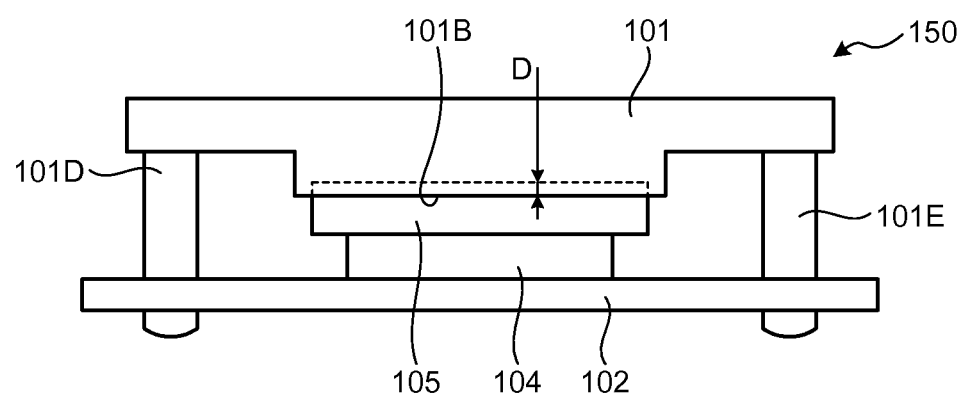
FIG. 17 is a front view illustrating a schematic configuration of a conventional electronic device as a comparison example.
Figure 18:
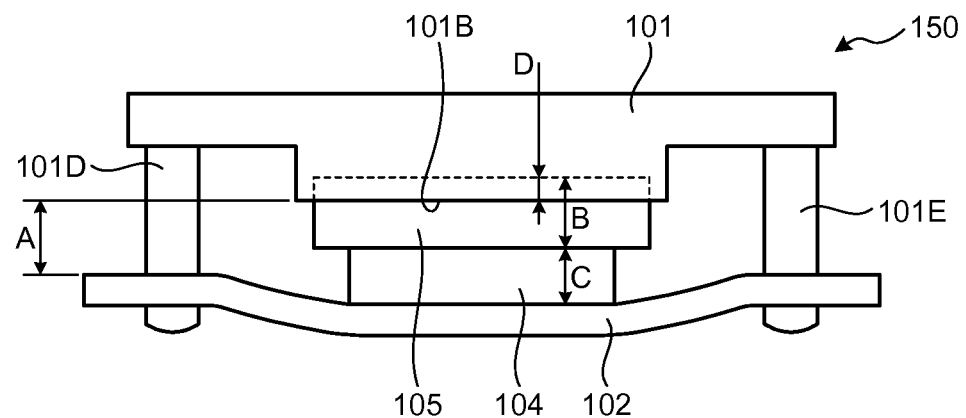
FIG. 18 is a front view of the electronic device illustrated in FIG. 17 and is a diagram illustrating an example in which the dimension between a heat transfer surface of a heat dissipation fin and a printed circuit board is varied to a minimum tolerance.
Figure 19:
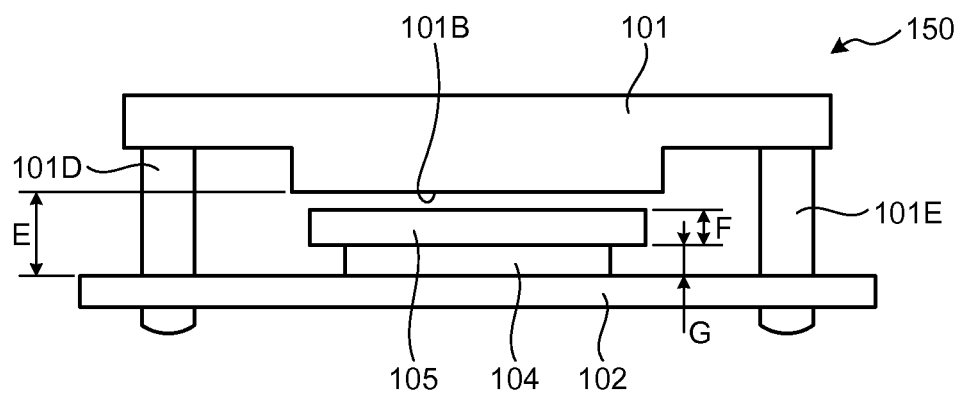
FIG. 19 is a front view of the electronic device illustrated in FIG. 17 and is a diagram illustrating an example in which the dimension between the heat transfer surface of the heat dissipation fin and the printed circuit board is varied to a maximum tolerance.

FIG. 17 is a front view illustrating a schematic configuration of a conventional electronic device as a comparison example. FIG. 18 is a front view of the electronic device illustrated in FIG. 17 and is a diagram illustrating an example in which the dimension between a heat transfer surface of a heat dissipation fin and a printed circuit board is varied to a minimum tolerance. FIG. 19 is a front view of the electronic device illustrated in FIG. 17 and is a diagram illustrating an example in which the dimension between the heat transfer surface of the heat dissipation fin and the printed circuit board is varied to a maximum tolerance.

An electronic device 150 illustrated as a comparison example is such that a heat transfer surface 101B of a heat dissipation fin 101 is a flat surface and the heat dissipation fin 101 and a heat conductive sheet 105 are fixed to a printed circuit board 102 via bosses 101D and 101E formed on the heat dissipation fin 101.

As illustrated in FIG. 18, the dimension, with which the distance between the bosses 101D and 101E of the heat dissipation fin 101 and the heat transfer surface 101B becomes a minimum tolerance, is defined as A, the dimension, with which the thickness of the heat conductive sheet 105 becomes a maximum tolerance, is defined as B, the dimension, with which the height of the electronic component becomes a maximum tolerance, is defined as C, and a heat conductive sheet compression dimension, with which strain and deflection generated in the printed circuit board 102 fall within a reference value, is defined as D.

In this case, when dimension B+dimension C−dimension D>dimension A is satisfied, strain and deflection that exceed a reference value are generated in the printed circuit board 102; therefore, a mounted electronic component 104, a wiring pattern, or the like is damaged.

Moreover, as illustrated in FIG. 19, the dimension, with which the distance between the bosses 101D and 101E of the heat dissipation fin 101 and the heat transfer surface 101B becomes a maximum tolerance, is defined as E, the dimension, with which the thickness of the heat conductive sheet 105 becomes a minimum tolerance, is defined as F, and the dimension, with which the height of the electronic component 104 becomes a minimum tolerance, is defined as G.

In this case, when dimension F+dimension G<dimension E is satisfied, the heat conductive sheet 105 is separated from the electronic component 104 or the heat transfer surface 101B and therefore the heat dissipation performance decreases significantly. Thus, a failure or the like of the electronic component 104 is induced, which may significantly shorten the life of the product.

Moreover, the heat conductive sheet 105 in this case is in close contact with any one of the heat transfer surface 101B and the electronic component 104; therefore, the heat conductive sheet 105 easily separates and falls depending on the direction in which the heat conductive sheet 105 is used.

In contrast, in the first embodiment and the like described above, the spring 3 elastically deforms; therefore, the dimension A and the dimension E can have some margin. Consequently, damage to the electronic component and separation of the heat conductive sheet can be prevented.

Moreover, in the second embodiment and the like described above, the projections 1C are formed on the heat transfer surface 1B of the heat dissipation fin 1; therefore, the dimension A and the dimension E can have some margin. Consequently, damage to the electronic component and separation of the heat conductive sheet can be prevented.

Figure 20:
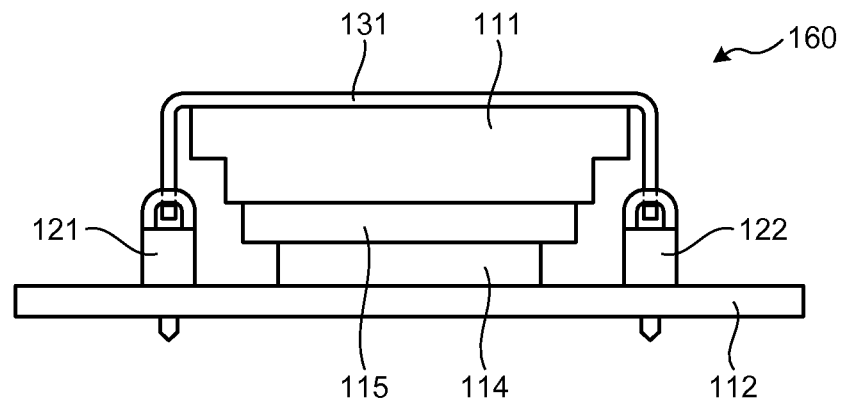
FIG. 20 is a front view of an electronic device illustrating a schematic configuration of a conventional electronic device as another comparison example.

FIG. 20 is a front view of an electronic device illustrating a schematic configuration of a conventional electronic device as another comparison example. In an electronic device 160, which is another comparison example, hooks 121 and 122 are mounted on a printed circuit board 112 and an elastic spring 131 is locked onto the hooks 121 and 122, thereby fixing a heat dissipation fin 111 and the like.

In this case, the hooks 121 and 122 need to have a fixing strength sufficient to prevent the hooks 121 and 122 from coming off the printed circuit board 112; therefore, the hooks 121 and 122 are in many cases mounted by causing them to extend through the printed circuit board 112 and soldering them. An insulation distance is needed between the hooks 121 and 122 and the peripheral electronic components on both the front and back sides of the printed circuit board 112. Therefore, the footprint on the printed circuit board 112 is reduced, which results in reducing the number of electronic components and wiring patterns that can be mounted.

Moreover, cracks are generated due to the long-term stress applied to the solder that fixes the hooks 121 and 122 and the hooks 121 and 122 may come off. If the hooks 121 and 122 come off, the spring 131, the heat dissipation fin 111, a heat conductive sheet 115, and an electronic component 114 may be dropped.

In contrast, in the first embodiment and the like described above, the notches 2C are formed to lock the spring 3 without providing a hook on the printed circuit board 2; therefore, a reduction of the footprint can be prevented.

INDUSTRIAL APPLICABILITY

As described above, the fixing unit according to the present invention is useful for fixing a heat dissipation fin and a heat conductive sheet in an electronic device.

REFERENCE SIGNS LIST 1 heat dissipation fin
1A guide groove
1B heat transfer surface
1C projection
1D, 1E boss
1F projection portion
1G contact portion
1H apex
2 printed circuit board
2A, 2B locking portion
2C notch
3 spring (fixing unit)
3A, 3B hook portion
3C spring central portion
3D, 3E spacing portion
3F, 3G tip
4 electronic component
5 heat conductive sheet
6 casing
6A, 6B rib
9 screw
50, 60, 70, 80, 90 electronic device
101 heat dissipation fin
101D, 101E boss
101B heat transfer surface
102 printed circuit board
104 electronic component
105 heat conductive sheet
111 heat dissipation fin
112 printed circuit board
114 electronic component
115 heat conductive sheet
121, 122 hook
131 spring
150, 160 electronic device

The invention claimed is:

1. An electronic device comprising:
a printed circuit board that has a prohibited region in which arrangement of a wiring pattern is prohibited, the prohibited region being formed to be directly adjacent to an edge of the printed circuit board;
an electronic component mounted on the printed circuit board;
a heat dissipation fin provided on the electronic component; and
a fixing unit that fixes the heat dissipation fin by pressing the heat dissipation fin against the printed circuit board side, wherein
the fixing unit exerts an elastic force that presses the heat dissipation fin against the printed circuit board side by being locked to a notch formed in the prohibited region of the printed circuit board,
a hook portion of the fixing unit that is locked to the notch is arranged in the prohibited region, and
the notch extends from the edge of the printed circuit board into the prohibited region.

2. The electronic device according to claim 1, wherein the fixing unit is made of a conductive material.

3. The electronic device according to claim 1, wherein the notch is formed in both of a first region adjacent to a first edge of the printed circuit board and a second region adjacent to a second opposite edge of the printed circuit board, and
wherein the electronic component is mounted between the first region and the second region.

4. The electronic device according to claim 1, further comprising a heat conductive sheet interposed between the electronic component and the heat dissipation fin.

5. The electronic device according to claim 1, wherein the fixing unit has a point symmetrical shape.

6. The electronic device according to claim 4, wherein a plurality of projections is formed on a heat transfer surface of the heat dissipation fin, the heat transfer surface being in contact with the heat conductive sheet.

7. The electronic device according to claim 6, wherein a heat dissipation effect of dissipating heat from the electronic component via the heat dissipation fin is obtained by bringing apexes of the plurality of projections into contact with the heat conductive sheet.

8. The electronic device according to claim 1, wherein the fixing unit has a rod-like shape, is configured to include a central portion that is in contact with the heat dissipation fin, spacing portions that are bent toward the printed circuit board side at both ends of the central portion and extend through the notches, and the hook portions that are bent toward the printed circuit board side at tips of the spacing portions and are locked to the notches, and exerts the elastic force by using a restoring force of a bent portion at the tips of the spacing portions.

9. The electronic device according to claim 8, wherein
the fixing unit is capable of fixing the heat dissipation fin by being moved in a predetermined direction in a state where one of the hook portions is locked to the notch and the central portion is in contact with the heat dissipation fin, and the electronic device further includes a projection portion that is provided in a portion of the notch and protrudes into a movement path of the spacing portion.

10. The electronic device according to claim 9, further comprising a contact portion that is provided in the portion of the notch and restricts a movement of the fixing unit by an amount equal to or more than a fixed amount by coming into contact with the fixing unit.

11. The electronic device according to claim 1, further comprising a casing that accommodates therein the printed circuit board, wherein
   a rib, which restricts a movement of the fixing unit by coming into contact with the fixing unit, is formed on an inner wall of the casing.

12. The electronic device according to claim 1, wherein the hook portion is formed to extend from the notch in a direction along the edge of the printed circuit board.

* * * * *